United States Patent [19]
Katayama et al.

[11] Patent Number: 5,545,258
[45] Date of Patent: Aug. 13, 1996

[54] MICROWAVE PLASMA PROCESSING SYSTEM

[75] Inventors: Katsuo Katayama; Kyoichi Komachi; Hiroshi Mabuchi, all of Osaka; Takeshi Akimoto, Tokyo, all of Japan

[73] Assignees: Sumitomo Metal Industries, Ltd., Osaka; NEC Corporation, Tokyo, both of Japan

[21] Appl. No.: 490,088

[22] Filed: Jun. 13, 1995

[30] Foreign Application Priority Data

Jun. 14, 1994 [JP] Japan ................. 6-132031
Jun. 14, 1994 [JP] Japan ................. 6-132032
Jun. 14, 1994 [JP] Japan ................. 6-132033

[51] Int. Cl.$^6$ .................................. C23C 16/00
[52] U.S. Cl. .................. 118/723 MP; 118/723 MW; 118/723 E; 204/298.38; 156/345
[58] Field of Search .............. 156/345; 204/298.38; 118/723 MP, 723 ME, 723 MW, 723 E, 723 ER; 313/231.31; 315/111.21

[56] References Cited

U.S. PATENT DOCUMENTS

| | | | |
|---|---|---|---|
| 5,017,404 | 5/1991 | Paquet et al. | 427/45.1 |
| 5,134,965 | 8/1992 | Tokuda et al. | 118/723 M W |
| 5,342,472 | 8/1994 | Imahashi et al. | 156/345 |
| 5,364,519 | 11/1994 | Fujimura et al. | 204/298.38 |
| 5,415,719 | 5/1995 | Akimoto | 156/643 |

FOREIGN PATENT DOCUMENTS

| | | |
|---|---|---|
| 0183561 | 6/1986 | European Pat. Off. . |
| 0591975 | 4/1994 | European Pat. Off. . |
| 91-290447 | 8/1991 | Japan ............. 118/723 MP |

*Primary Examiner*—R. Bruce Breneman
*Assistant Examiner*—Joni Y. Chang
*Attorney, Agent, or Firm*—Burns, Doane, Swecker & Mathis, L.L.P.

[57] ABSTRACT

A microwave plasma processing system, wherein a conductor disposed for controlling the anisotropy and the acceleration energy of ions in a plasma has inside a flow path for reactant gasses and a plurality of holes through which the gasses are to be blown toward a sample holder.

A microwave plasma processing system, wherein the ratio of the total area of microwave transmission holes to the area of a conductor is set to be in a range of 0.25 to 0.65.

A microwave plasma processing system, wherein each microwave transmission hole formed in a conductor has a dimension in the microwave traveling direction greater than that in a direction perpendicular to the traveling direction.

8 Claims, 15 Drawing Sheets

TRAVELING
DIRECTION OF ⇨
MICROWAVE

MICROWAVE PLASMA PROCESSING SYSTEM

BACKGROUND OF THE INVENTION

1. Field of the Invention

The invention relates to a microwave plasma processing system which is used for performing a processing such as etching, ashing, or thin film formation in a production of a semiconductor device.

2. Description of Related Art

In a microwave plasma processing system, a gas discharge is generated in a vacuum vessel under a reduced pressure or a low gas pressure by introducing microwaves into the vessel, thereby generating a plasma, and the surface of a substrate which is a sample is irradiated with the generated plasma so that a processing such as etching, or thin film formation is performed on the substrate. Since such a plasma processing system is essential in the production of a highly integrated semiconductor device and the like, research and development are intensively conducted on the system. Particularly, a microwave plasma processing system in which the generation of a plasma and the acceleration of ions in the generated plasma can independently be controlled is desired in the dry etching technique, and the burying technique for thin film formation.

FIG. 1 shows a conventional microwave plasma processing system 400. The system is aimed at independently controlling the generation of a plasma, and the acceleration of ions in the plasma. Specifically, the objectives of the system are to generate a stable bias voltage at the surface of a sample when a high frequency electric field is applied to a sample holder so as to optimize the energy of ions in a plasma, and to perpendicularly irradiate the surface of the sample with ions. In the figure, numeral 40 designates a reactor which is made of a metal such as aluminum, or stainless steel. The reactor 40 is airtightly partitioned by a microwave introduction window 45. The window consists of a refractory plate made of a material such as quartz glass, or $Al_2O_3$ which allows microwaves to be transmitted therethrough, produces a small dielectric loss and has heat resistance.

In the upper portion of the reactor 40 which is partitioned by the microwave introduction window 45, disposed is a dielectric passage 44 which opposes the microwave introduction window 45 with being separated therefrom by a predetermined distance, and which has a size sufficient for covering the microwave introduction window 45. The dielectric passage 44 comprises a dielectric layer 44a which is made of a dielectric material producing a small dielectric loss, such as fluororesin, polystyrene, or polyethylene, and a metal plate 44b which is made of Al or the like and disposed on the upper face of the dielectric layer 44a. Microwaves are introduced from a microwave oscillator 47 into the dielectric passage 44 via a waveguide 46. The terminal of the dielectric passage 44 is sealed by the metal plate 44b.

In the lower portion which is partitioned by the microwave introduction window 45, a reaction chamber 41 is formed. A sample stage 42 having a sample holder 42a for holding a sample S which is to be processed is disposed inside the reaction chamber 41. A high frequency power source 43 for generating a bias voltage at the surface of the sample S is connected to the sample holder 42a. The sample holder 42a is provided with a suction mechanism for sucking the sample S such as an electrostatic chuck, and a cooling mechanism for cooling the sample S which uses a circulating coolant or the like. A metal plate 51 which is connected to the ground 52 via the reactor 40 is disposed in closely contact with the lower face of the microwave introduction window 45 which opposes the sample S. A large number of slits (or holes) 51a are formed in the metal plate 51 so that microwaves enter the reaction chamber 41. The metal plate 51 serves as an anode which is confronted with a cathode (the sample holder 42a) connected to the high frequency power source 43, thereby allowing a distinct bias voltage to be generated to the sample S mounted on the cathode.

The side wall of the reaction chamber 41 has a double-wall structure so that a cavity serving as a passage 50 for cooling water is formed inside the double-structured side wall. A cooling water inlet pipe 50a and a cooling water outlet pipe 50b are communicated with the passage 50. A gas supply pipe 48 through which gasses required for generating a plasma are supplied into the reaction chamber 41 is connected to the upper portion of the side wall. A gas discharge port 49 which is connected to an evacuating apparatus and through which the reaction chamber 41 is evacuated to attain a vacuum is coupled to the lower portion of the side wall.

Hereinafter, the case where a processing, for example, of an etching is to be performed on the surface of the sample S in the thus configured microwave plasma processing system 400 will be described.

First, evacuation is conducted through the gas discharge port 49 to set the interior of the reaction chamber 41 to have a predetermined pressure, and reactant gasses are then supplied through the gas supply pipe 48. Cooling water is supplied from the cooling water inlet pipe 50a to be circulated in the cavity 50, and then discharged into the cooling water outlet pipe 50b. Then the microwave oscillator 47 oscillates microwaves and the generated microwaves are introduced into the dielectric passage 44 via the waveguide 46 so that an electric field is generated under the dielectric passage 44. The generated electric field is transmitted through the microwave introduction window 45 and passes through the slits (or holes) 51a of the grounded metal plate 51 so that a plasma is generated in the reaction chamber 41. At the same time, in order to control the anisotropy and the acceleration energy of ions in the plasma, the high frequency power source 43 applies a high frequency electric field to the sample holder 42a on which the sample S is mounted. Then a stable bias voltage is generated at the surface of the sample S by the action of the grounded metal plate 51. The bias voltage causes the ions to be perpendicularly incident upon the sample S, and controls the energy of the ions incident upon the sample S, whereby the etching conditions are optimized.

In the microwave plasma processing system, the reactant gasses are introduced into the reaction chamber 41 with passing through the side wall of the reactor 40 (the reaction chamber 41) via the gas supply pipe 48, and are not directly supplied toward the sample S. Therefore, it is difficult to improve the utilization efficiency of reactant gasses, and the gasses flow toward the processed face of the sample S is ununiform. Consequently, it is difficult to improve the uniformities of processing, such as those of the etch rate, and the selection ratio of the $SiO_2$ with respect to Si.

In order to enable the electric field generated from the dielectric passage 44 to enter the reaction chamber 41 via the microwave introduction window 45, the microwave transmission holes 51a having a slit-like or circular shape are formed in the metal plate 51. However, the shape of the microwave transmission holes 51a which is suitable for generating a high-density and uniform plasma is not revealed.

FIG. 2 is a schematic section view showing a conventional microwave plasma processing system which is proposed by the applicant in Japanese Patent Application Laid-Open No. 6-104098 (1994) with the objective of independently controlling the generation of a plasma and the acceleration of ions in the plasma.

In the system, a metal plate 53 is disposed so as to be in contact with the lower face of a microwave introduction window 45, or to be positioned at the midpoint between the microwave introduction window 45 and a sample holder 42a. A plurality of slits 53a which elongate in a direction perpendicular to the microwave traveling direction are formed in the metal plate 53. The metal plate 53 is grounded via a reactor 40 (as indicated by 52). The sample holder 42a for holding a sample S and a sample stage 54 on which the holder is mounted are disposed at a location opposing the metal plate 53 in a reaction chamber 41. The sample stage 54 is coupled with a driving mechanism so as to be vertically moved up and down. The other components similar to those of FIG. 1 are designated by the same reference numerals.

In the thus configured microwave plasma processing system, for example, a process of etching the surface of the sample S mounted on the sample holder 42a is performed in the following manner. First, the position of the sample S mounted on the sample holder 42a is adjusted by using the driving mechanism so that the sample is positioned at a predetermined height. Thereafter, evacuation is conducted through the discharge port 49. Reactant gasses are then introduced into the reaction chamber 41 via the gas supply pipe 48 and the interior of the reaction chamber 41 is set to have a desired pressure. Cooling water is supplied from the cooling water inlet pipe 50a to be circulated in the passage 50, and then discharged into the cooling water outlet pipe 50b. Then the microwave oscillator 47 oscillates microwaves and the generated microwaves are introduced into the dielectric passage 44 via the waveguide 46 so that an electric field is generated under the dielectric passage 44. The electric field is transmitted through the microwave introduction window 45 and passes through the slits 53a formed in the grounded metal plate 53 so that a plasma is generated in the reaction chamber 41. Then the high frequency power source 43 applies a high frequency electric field to the sample holder 42a so that a stable bias voltage is generated at the surface of the sample S by the action of the grounded metal plate 53. Then etching is performed while the bias voltage which is stably generated causes ions in the plasma to be perpendicularly incident upon the sample S and controls the energy of the ions.

In the microwave plasma processing system, the grounded metal plate 53 having the slits 53a is disposed so as to be in contact with the microwave introduction window 45 or to be positioned at the midpoint between the microwave introduction window 45 and the sample holder 42a. As a result, the ground potential with respect to the plasma is made stable so that the plasma potential is stabilized. When the high frequency electric field is applied to the sample holder 42a, therefore, a stable bias voltage can be generated at the surface of the sample S, the energy of the ions in the plasma can be optimized, and the ions can be perpendicularly irradiated on the surface of the samples. In the case where the ratio of the total area of the slits 53a to the outer form area of the metal plate 53 is small, a stable bias voltage can be generated. In such a case, however, there arises a problem that it is difficult to maintain a stable plasma discharge state based on a sufficient transmission of microwaves.

By contrast, in the case where the ratio of the total area of the slits 53a to the outer form area of the metal plate 53 is large, a stable plasma discharge can be generated. However, a problem is produced that it is difficult to generate the uniform and high bias voltage based on the distinct ground potential.

SUMMARY OF THE INVENTION

The invention has been conducted in order to solve the above-discussed problems. It is an object of the invention to provide a microwave plasma processing system capable of increasing the efficiency of utilizing reactant gasses and of improving the uniformities of processing, such as those of the etch rate and the selection ratio by uniformalizing the flow of the reactant gasses.

The microwave plasma processing system according to the invention is characterized in that a conductor which is disposed with the objective of controlling the anisotropy and the acceleration energy of ions in a plasma has inside a flow path for reactant gasses and also has a plurality of holes through which the gasses are to be blown toward a sample holder.

In a microwave plasma processing system, in order to improve the efficiency of utilizing reactant gasses and the uniformities of processing, it is preferable to cause the reactant gasses to perpendicularly or the surface of a sample to be processed. In a process of etching $SiO_2$, particularly, which increase the selection ratio by using the CVD or a deposition film, the uniformities of processing are largely influenced by the flow of the reactant gasses.

In the microwave plasma processing system having the above-mentioned configuration, the flow path for reactant gasses is formed in the conductor, and the plurality of holes through which the gasses are blown from the reactant gas flow path toward the sample holder are formed in the face of the conductor opposing the sample holder. Therefore, the reactant gasses are temporarily introduced into the reactant gas flow path and then supplied perpendicularly and uniformly from the plurality of holes to the face of a sample to be processed held by the sample holder. This enables the reactant gasses to efficiently reach the face of the sample to be processed in a direct manner. That is, the reactant gasses can reach the face of the sample to be processed without making detour so that the gasses are prevented from being wastefully consumed on the side wall and the like. Consequently, the efficiency of utilizing the reactant gasses can be improved as compared with a conventional microwave plasma processing system. Moreover, the flow of the reactant gasses toward the face of the sample to be processed can be made uniform. Therefore, the uniformities of processing, such as those of the etch rate, and the selection ratio can be improved.

It is another object of the invention to provide a microwave plasma processing system in which the plasma potential can be stabilized while stabilizing the plasma discharge, and the bias voltage which is generated at the surface of a sample when a high frequency electric field is applied to the sample via a sample holder can be stabilized.

The microwave plasma processing system according to the invention is characterized in that the ratio of the total area of microwave transmission holes to the outer form area of a grounded conductor is set to be in the range of 0.25 to 0.65.

In the microwave plasma processing system having the above-mentioned configuration, since the ratio of the total area of the microwave transmission holes to the outer form area of the grounded conductor is set to be equal to or greater than a predetermined value, microwaves can sufficiently be transmitted the sample holder side via the microwave transmission holes so that the plasma is stably generated. Since the ratio of the total area of the microwave transmission holes to the outer form area of the conductor is set to be equal to or smaller than another predetermined value, the ground potential area is ensured and the high bias voltage can be generated at the surface of a sample is stabilized.

It is a further object of the invention to provide a microwave plasma processing system in which a distinct bias voltage can be generated at the surface of a sample, and a grounded conductor which can generate a plasma in a high density and uniform state is disposed.

The microwave plasma processing system according to the invention is characterized in that each microwave transmission holes formed in a conductor has a dimension in the microwave traveling direction which is greater than that in a direction perpendicular to the traveling direction.

When a processing such as etching, or thin film formation is to be performed on the surface of a sample by irradiation of a plasma generated by an electric field based on microwaves, microwave transmission holes having a size sufficient for transmission of the electric field based on microwaves must be formed in a grounded conductor disposed on the lower face of a microwave introduction window. Microwaves travel in parallel to a dielectric passage (plasma generation plane). In order to generate a uniform plasma, therefore, it is preferable to set the range where a plasma is generated to be always constant as seen a section (FIG. 2) of a reactor perpendicular to the microwave traveling direction. For realization of such a state, it is preferable that each the microwave transmission hole formed in the grounded conductor has a shape which is elongated in the microwave traveling direction and the number of microwave transmission holes arranged in the microwave traveling direction is set to be a value as small as possible.

In the microwave plasma processing system having the above-mentioned configuration, since the dimension of the microwave transmission holes in the microwave traveling direction is set to be greater than that in a direction perpendicular to the traveling direction, a plasma can be generated in a high density and uniform state.

The above and further objects and features of the invention will more fully be apparent from the following detailed description with accompanying drawings.

DESCRIPTION OF THE PREFERRED EMBODIMENTS

Hereinafter, the invention will be described in detail with reference to the drawings showing its embodiments.

Embodiment 1

Figure 3:
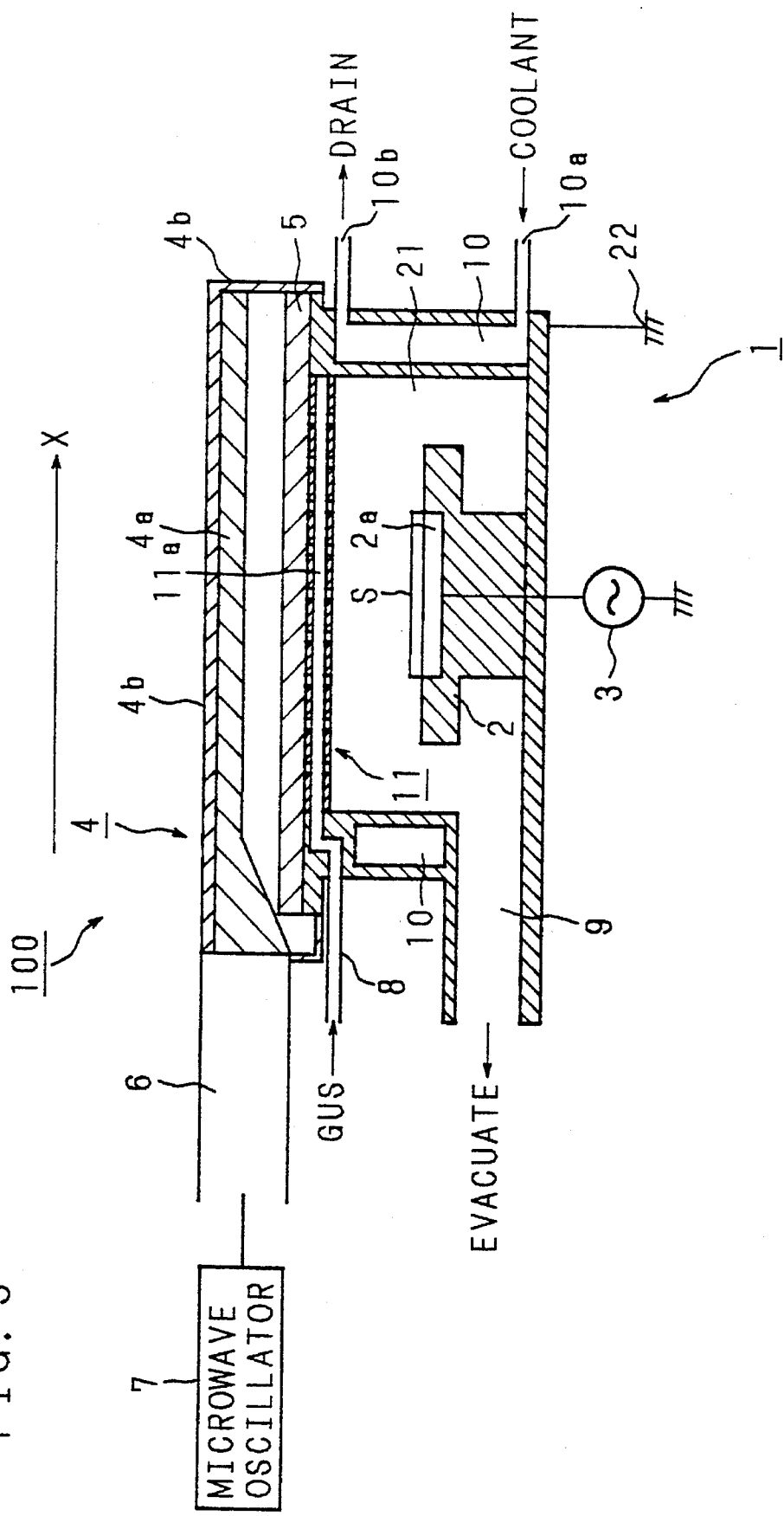
FIG. 3 is a schematic section view showing a microwave plasma processing system of Embodiment 1.

FIG. 3 is a section view schematically showing a microwave plasma processing system 100 of Embodiment 1. In the figure, numeral 1 designates a reactor having a hollow rectangular parallelepipedic shape. The reactor 1 is made of a metal such as aluminum, or a stainless steel. The reactor 1 is airtightly partitioned by a microwave introduction window 5. The window 5 consists of a refractory plate made of a material such as quartz glass, or $Al_2O_3$ which allows microwaves to be transmitted therethrough, produces a small dielectric loss and has heat resistance.

In the upper portion of the reactor 1 which is partitioned by the microwave introduction window 5, disposed is a dielectric passage 4 which opposes the microwave introduction window 5 with being separated therefrom by a predetermined distance, and which has a size sufficient for covering the microwave introduction window 5. The dielectric passage 4 comprises a dielectric layer 4a which is made of a dielectric material producing a small dielectric loss, such as fluororesin, polystyrene, or polyethylene, and a metal plate 4b which is made of Al or the like and disposed on the upper face of the dielectric layer 4a. Microwaves are introduced from a microwave oscillator 7 into the dielectric passage 4 via a waveguide 6. The terminal of the dielectric passage 4 is sealed by the metal plate 4b.

In the lower portion which is partitioned by the microwave introduction window 5, a reaction chamber 21 is formed. A sample stage 2 having a sample holder 2a for holding a sample S which is to be processed is disposed inside the reaction chamber 21. A high frequency power source 3 for generating a bias voltage at the surface of the sample S is connected to the sample holder 2a. The sample holder 2a is provided with a suction mechanism for sucking the sample S such as an electrostatic chuck or the like, and a cooling mechanism for cooling the sample S which uses a circulating coolant or the like. A metal plate 11 which is connected to the ground 22 via the reactor 1 is disposed in closely contact with the lower face of the microwave introduction window 5 which opposes the sample S. The metal plate 11 serves as an anode which is confronted with a cathode (the sample holder 2a) connected to the high frequency power source 3, thereby allowing a distinct bias voltage to be generated in the sample S mounted on the cathode.

The side wall of the reaction chamber 21 has a double-wall structure so that a cavity serving as a passage 10 for cooling water is formed inside the double-structured side wall. Cooling water is introduced into the passage 10 from a cooling water inlet pipe 10a, and then discharged therefrom into a cooling water outlet pipe 10b. A gas supply pipe 8 through which gasses required for generating a plasma are supplied into the reaction chamber 21 is connected to the upper portion of the side wall. A gas discharge port 9 which is connected to an evacuating apparatus and through which the reaction chamber 21 is evacuated to attain a vacuum is formed in the lower portion of the side wall.

Figure 1:
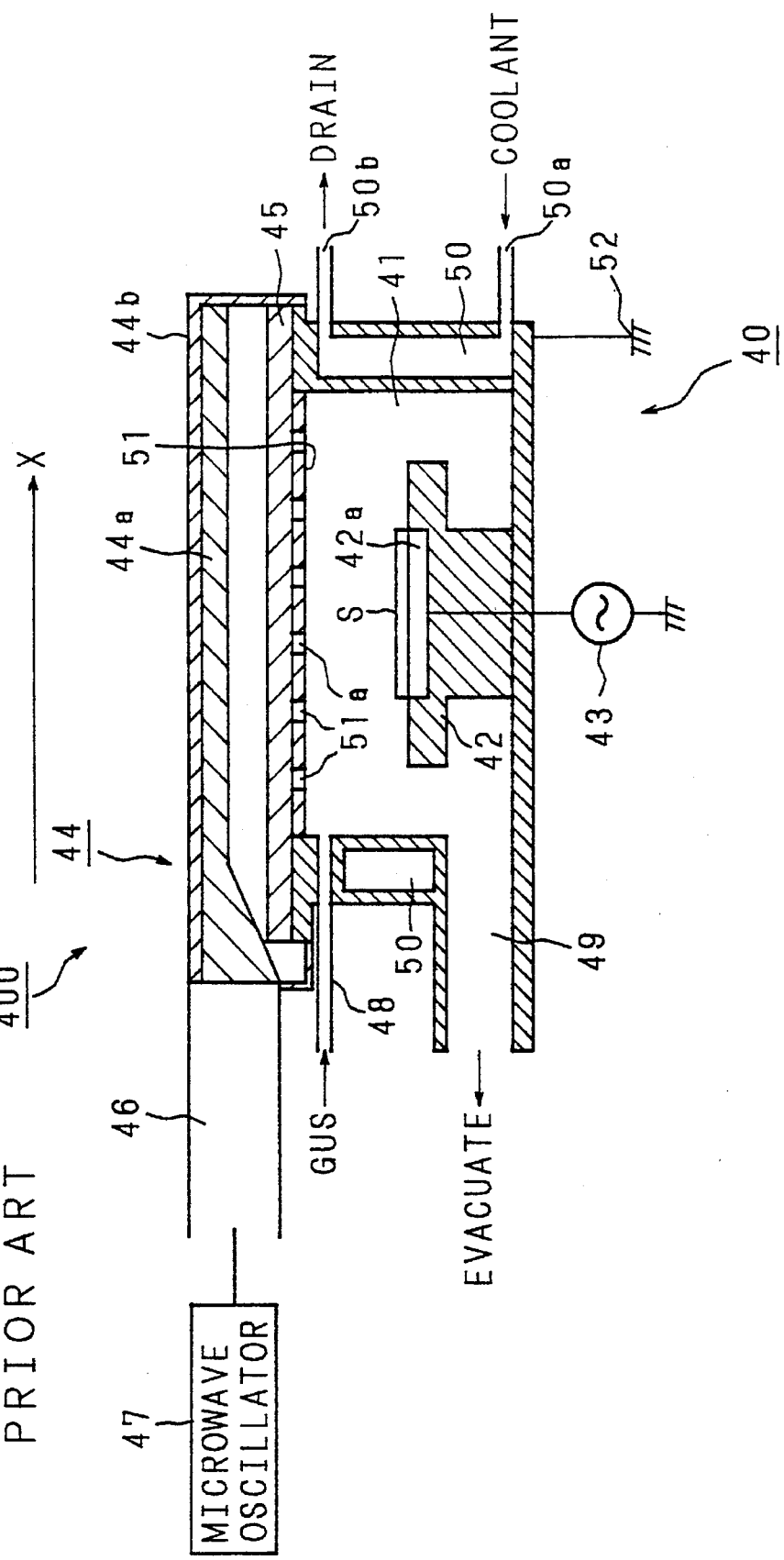
FIG. 1 is a schematic section view showing a conventional microwave plasma processing system.
Figure 2:
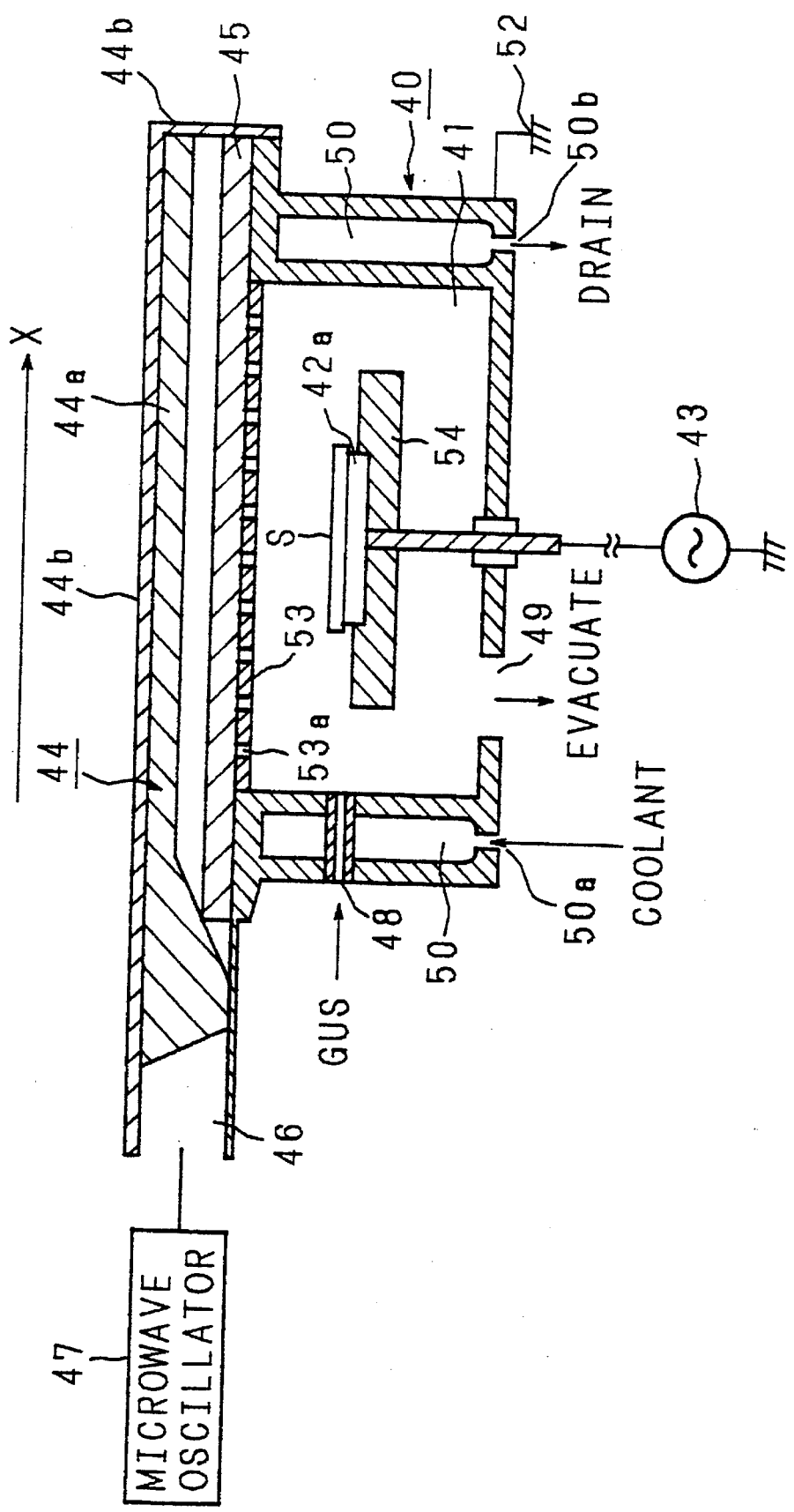
FIG. 2 is a schematic section view showing another conventional microwave plasma processing system.

The microwave plasma processing system 100 is different in configuration from the conventional microwave plasma processing system 400 shown in FIG. 1 in the following points. In the microwave plasma processing system 400, the metal plate 51 which is the grounded conductor having microwave transmission holes is disposed in closely contact with the lower face of the microwave introduction window 45. By contrast, in the microwave plasma processing system 100, the metal plate 11 in which a gas buffer room 11a is formed is disposed as the conductor in closely contact with the lower face of the microwave introduction window 5, and the gas supply pipe 8 is communicated with the gas buffer room 11a.

The configuration of the metal plate 11 will be described with reference to FIG. 4A, 4B.

Figure 4A:
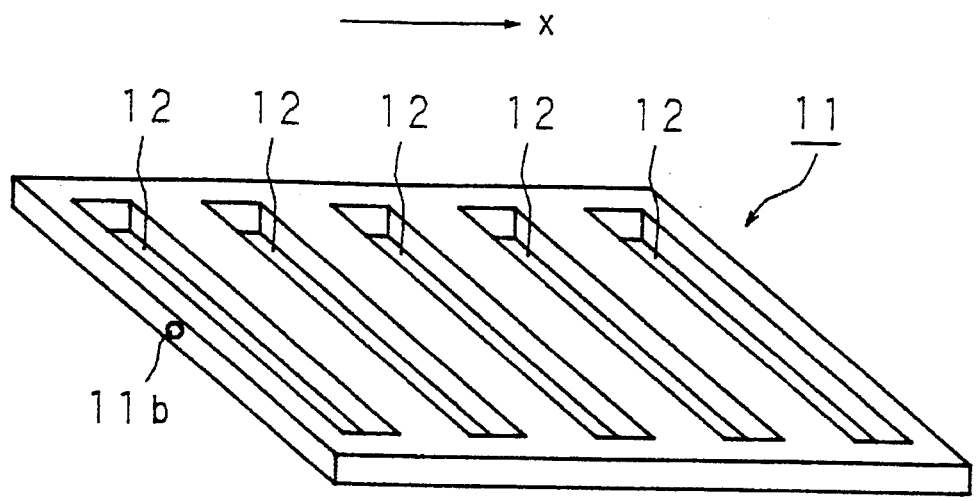
FIG. 4A is a perspective view of a metal plate shown in FIG. 3.
Figure 4B:
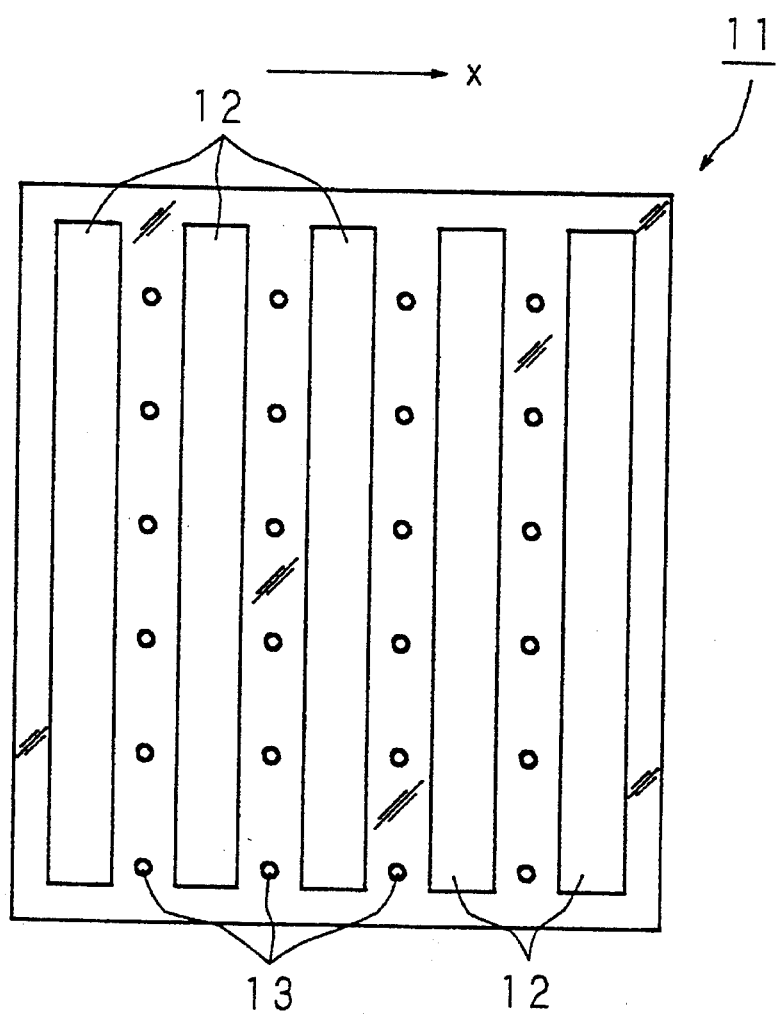
FIG. 4B is a bottom view of the metal plate shown in FIG. 3.

FIG. 4A is a perspective view of the metal plate 11 as seen from the side of the microwave introduction window 5, and FIG. 4B is a bottom view showing the face of the metal plate 11 opposing the sample holder 2a. As shown in FIG. 4A, slit-like microwave transmission holes 12 are formed in the metal plate 11. The microwave transmission holes 12 pierce the metal plate from the face in contact with the microwave introduction window 5 to the face opposing sample holder 2a. A gas introduction port 11b through which the gasses are to be introduced from the gas supply pipe 8 into the gas buffer room 11a is formed in the center position of one side face of the metal plate 11. On the other hand, a large number of small holes 13 through which the gasses introduced into the gas buffer room 11a are blown from the gas supply pipe 8 toward the face of the sample S to be processed are formed in the face of the metal plate 11 which opposes the sample holder 2a. The holes 13 have a predetermined diameter (for example, about 1 mm).

The metal plate 11 is made of an electrically conductive material such as Al, and connected to the ground 22 via the reactor 1. Therefore, the metal plate 11 serves as the anode electrode with respect to the sample holder 2a (cathode electrode) connected to the high frequency power source 3. Since the microwave transmission holes 12 are formed in the metal plate 11, microwaves are introduced into the reaction chamber 21 via the microwave introduction window 5 and the microwave transmission holes 12. The gas introduction port 11b connected to the gas supply pipe 8 is formed in the center position of one side face of the metal plate 11, and the large number of small holes 13 having a predetermined diameter are formed in the face opposing the sample stage 2. Consequently, the gasses supplied through the gas supply pipe 8 are temporarily stored in the gas buffer room 11a, and thereafter blown from the small holes 13 toward the face of the sample S to be processed.

As seen from the above description, in the microwave plasma processing system 100 of the embodiment, since the metal plate 11 connected to the ground 22 serves as the counter electrode (anode electrode) with respect to the sample holder 2a (cathode electrode) connected to the high frequency power source 3, the plasma potential can be stabilized and a stable bias voltage can be generated at the surface of the sample S in the same manner as the conventional microwave plasma processing system 400. This enables the energy of ions in a plasma to be optimized, and ions to be perpendicularly irradiated on the face of the sample S to be processed. In the microwave plasma processing system 100, additionally, since the gasses are blown from the large number of small holes 13 having the predetermined diameter, the gasses are blown uniformly and perpendicularly with respect to the face of the sample S to be processed so that the flow of the gasses toward the face to be processed can be kept uniform. As compared with the case where the microwave plasma processing system 400 is used, therefore, the use of the microwave plasma processing system 100 can improve the efficiency of utilizing gasses and the uniformities of processing, such as those of the etch rate, and the selection ratio with respect to different materials. The above-discussed contents will be demonstrated with using specific values.

Processes of etching a silicon oxide film ($SiO_2$ film) were performed by using the microwave plasma processing system 100 shown in FIG. 3. As the sample S, 8-inch silicon wafers on which an $SiO_2$ film of 1 μm was formed were used. As the reactant gasses, $CF_4$, $CHF_3$, and Ar were flown in the amounts of 30 sccm, 30 sccm, and 100 sccm, respectively. The gas pressure was 30 mTorr. A microwave of a frequency of 2.45 GHz was used, and a plasma was generated at a power of 1 kW. A high frequency electric field of a frequency of 400 kHz and a power of 600 W was applied to the sample holder 2a. As a comparison example, processes of etching an $SiO_2$ film were performed is the same condition as mentioned above by using the microwave plasma processing system 400 shown in FIG. 1. The results were compared with each other. The comparison results are shown in FIGS. 5A and 5B.

Figure 5A:
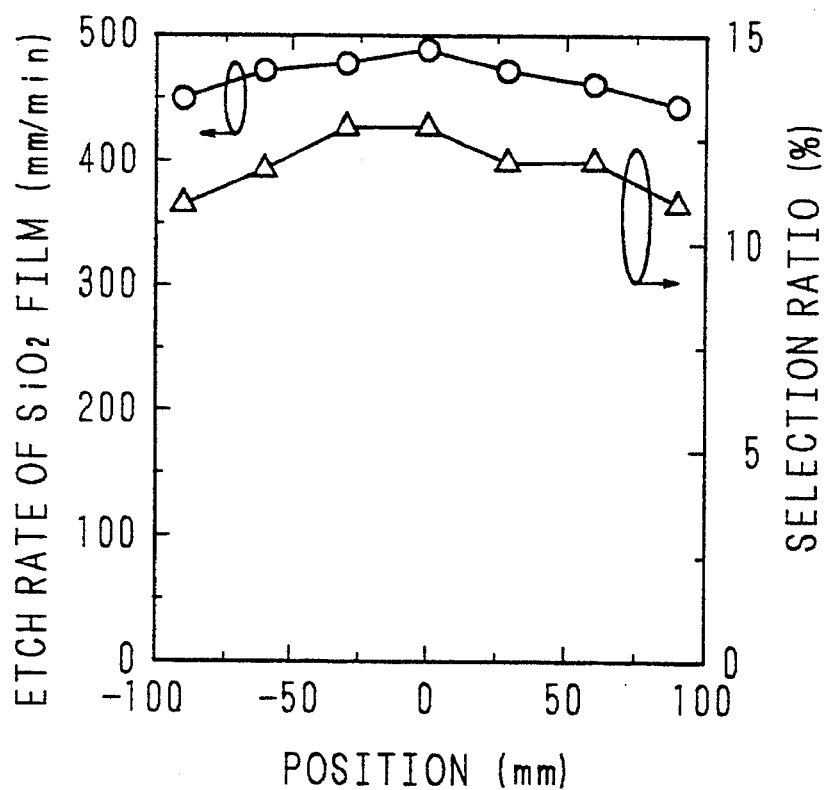
FIG. 5A is a graph showing the etch rate of an $SiO_2$ film and the selection ratio of the $SiO_2$ film with respect to Si in Embodiment 1.
Figure 5B:
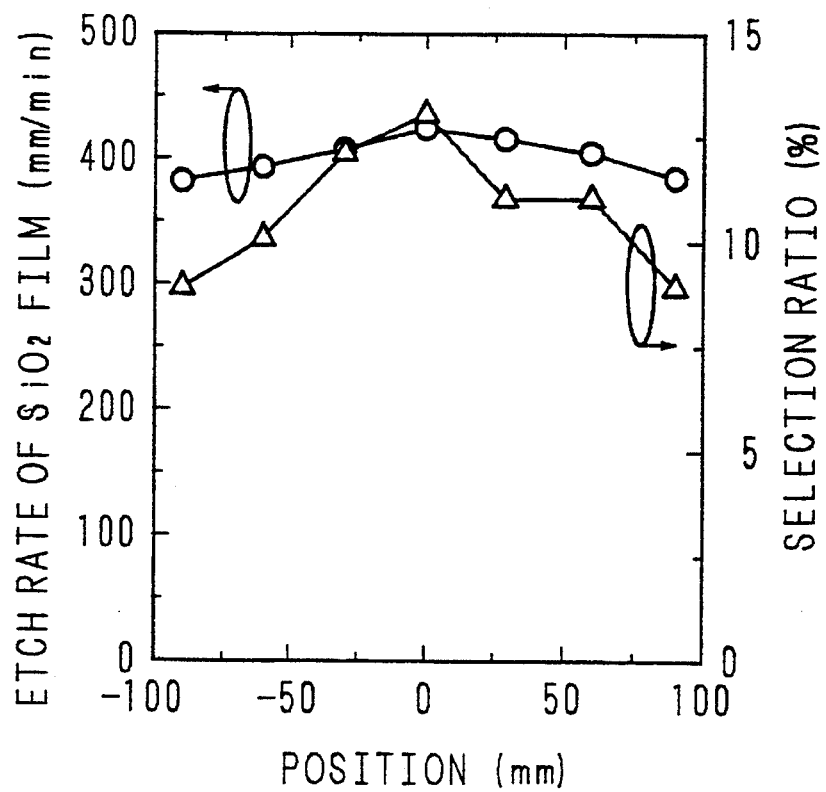
FIG. 5B is a graph showing the etch rate of an $SiO_2$ film and the selection ratio of the $SiO_2$ film with respect to Si in a conventional system.

FIG. 5A is a graph showing the results obtained by the microwave plasma processing system 100, and FIG. 5b is a graph showing the results obtained by the microwave plasma processing system 400. In FIGS. 5A and 5B, the curves indicated by ○ show the etch rate of the $SiO_2$ film, and the curves indicated by Δ show the selection ratio with respect to Si. The abscissae show the distance from the center (=0 mm) of the silicon wafer.

In the case where the microwave plasma processing system 100 was used, the average etch rate of the $SiO_2$ film was 450 nm/min., the uniformity of the etch rate in 8-inch silicon wafers was ±5%, and the selection ratio with respect to Si was ±5%. By contrast, in the case where the microwave plasma processing system 400 was used, the average etch rate of the $SiO_2$ film was 400 nm/min., and the uniformity of the etch rate in 8-inch silicon wafers was ±5%, but the selection ratio with respect to Si was ±15%. It is considered that the above phenomenon is caused by the following reason. In the etching of the $SiO_2$ film, energies are given to ions by the bias voltage, and the etching process is caused to proceed by the energies. When the plasma and the bias voltage are uniformly distributed, therefore, a uniform etching distribution is obtained. In contrast, it is considered that the etching of Si is caused to proceed by a chemical reaction due to neutral radicals, and hence depends on the gas flow.

In the above, the embodiment in which the microwave plasma processing system 100 was applied to an etching system has been described. The invention is not restricted to this, and can be applied also to other systems such as a thin film forming system.

As described above in detail, according to the embodiment, the flow path for reactant gasses is disposed inside the conductor, and the plurality of holes through which the gasses are to be blown toward the sample holder are formed in the face of the conductor opposing the sample holder. Therefore, the reactant gasses are temporarily introduced into the flow path, and then blown from the plurality of holes, whereby the reactant gasses can be blown perpendicularly and uniformly to the face of a sample to be processed. This enables the reactant gasses to directly reach the face of the sample to be processed in an improved efficiency. Therefore, the reactant gasses can reach the face of the sample to be processed without making detour so that the gasses are prevented from being wastefully consumed on the side wall and the like. Consequently, the efficiency of utilizing the reactant gasses can be improved. Moreover, the flow of the reactant gasses toward the face of the sample to be processed can be made uniform. Therefore, the uniformities of processing, such as those of the etch rate, and the selection ratio can be improved.

Embodiment 2

Figure 6:
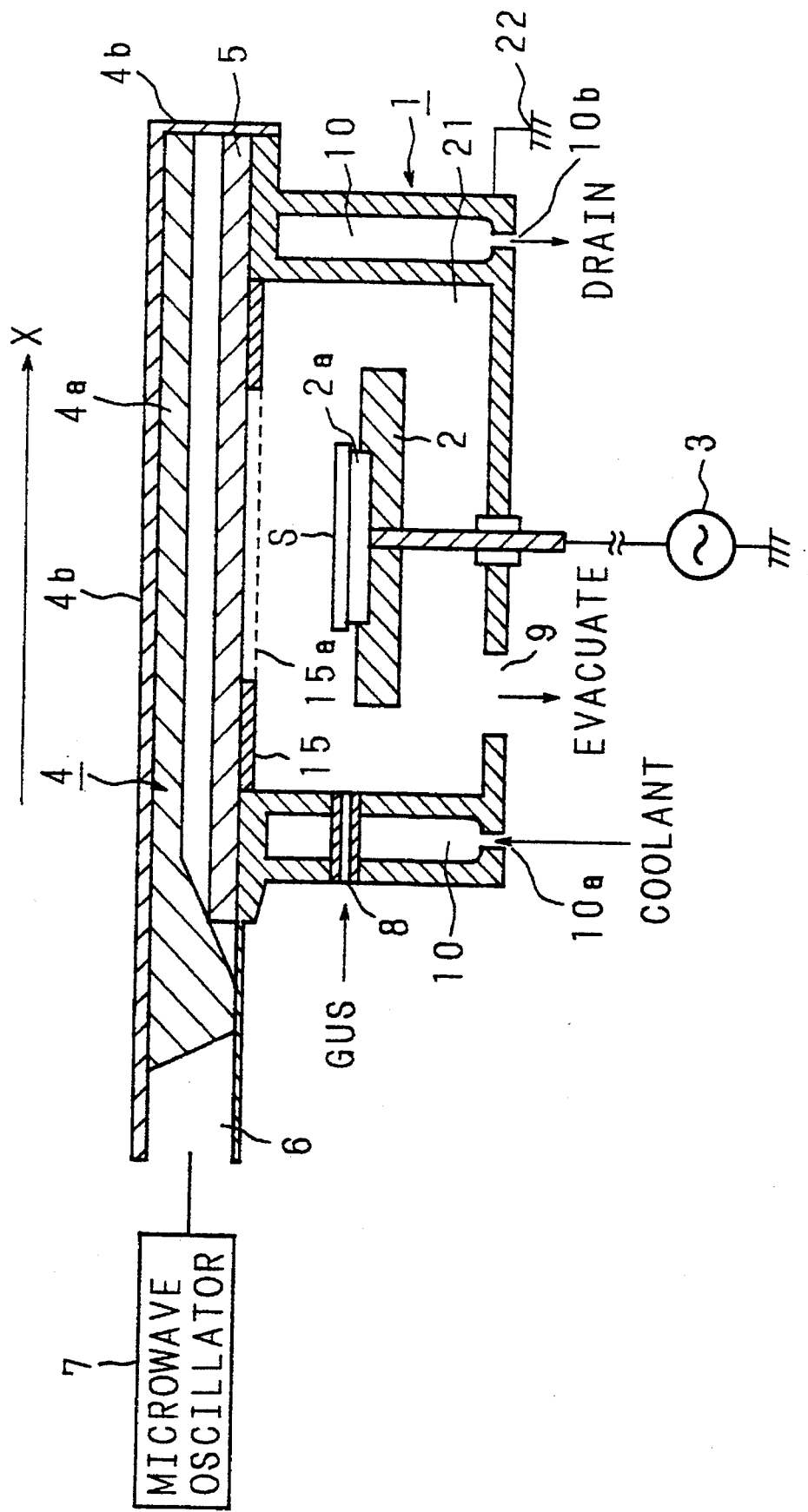
FIG. 6 is a schematic section view showing a microwave plasma processing system of Embodiment 2.
Figure 7:
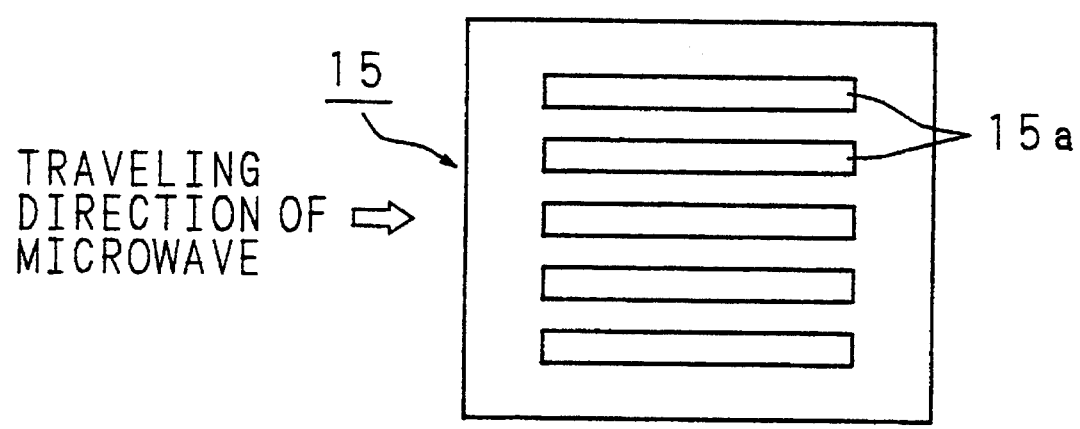
FIG. 7 is a plan view of a metal plate shown in FIG. 6.

FIG. 6 is a section view schematically showing a microwave plasma processing system of Embodiment 2. In the embodiment, a metal plate 15 which is made of aluminum and serves as the conductor is disposed inside the reactor 1 so as to be in parallel with the sample holder 2a. A plurality of rectangular microwave transmission holes 15a which elongate in the direction parallel to the microwave traveling direction x as shown in FIG. 7 are formed in the metal plate 15 so that microwaves are transmitted through the microwave introduction window 5 and pass through the microwave transmission holes 15a to be introduced into the reactor 1. In the embodiment, the grounded metal plate 15 is disposed so as to be in contact with the microwave introduction window 5. The invention is not restricted to this. The grounded metal plate 15 may be positioned at the midpoint between the microwave introduction window 5 and the sample holder 2a. In the embodiment, the material of the metal plate 15 is aluminum. The invention is not restricted to this. Any material may be used as far as it is electrically conductive and hardly causes pollution. For example, carbon, silicon, or a material having a thin surface oxide film (e.g., surface alumite and aluminum) may be used.

Figure 8A:
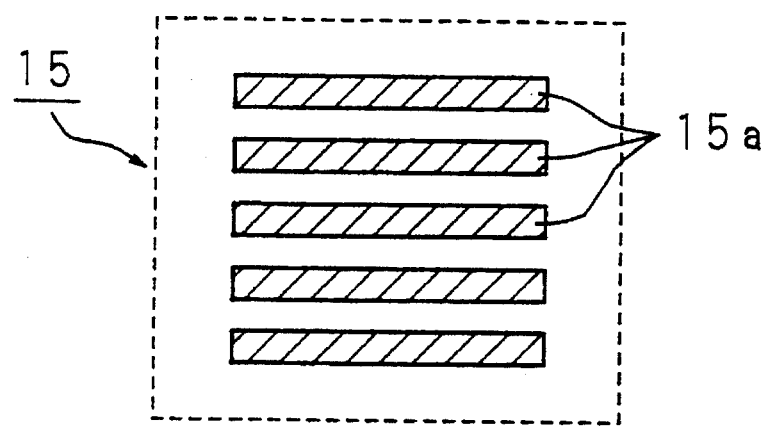
FIG. 8A is a diagram illustrating the total area of microwave transmission holes.
Figure 8B:
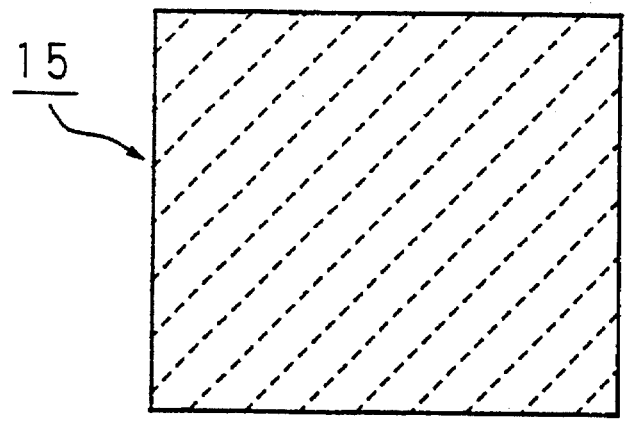
FIG. 8B is a diagram illustrating the outer form area of a metal plate.

The hatched portions in FIG. 8A indicate the total area of the microwave transmission holes 15a, and the hatched portion in FIG. 8B indicates the outer form area of the metal plate 15. In the embodiment, the rectangular microwave transmission holes 15a which elongate in the direction parallel to the microwave traveling direction are formed. The invention is not restricted to this. A plurality of microwave transmission holes which elongate in direction perpendicular to the microwave traveling direction, or a plurality of circular microwave transmission holes which are not particularly dependent on directions may be formed. Alternatively, these kinds of microwave transmission holes may be formed in combination. In the embodiment, the grounded metal plate 15 has a rectangular shape. The invention is not restricted to this. The metal plate may be circular. The other components are similar to those of Embodiment 1. These components are designated by the same reference numerals, and their description is omitted.

Hereinafter, results of processes of etching a silicon oxide film ($SiO_2$ film) which were performed by using the microwave plasma processing system of the embodiment will be described. In the etching processes, 8-inch silicon wafers on which an $SiO_2$ film of 1 µm was formed were used as the sample S, and about 30 sccm of $CF_4$, about 30 sccm of $CHF_3$, and about 100 sccm of Ar were supplied as the reactant gasses. The gas pressure of the reaction chamber 21 was set to be about 30 mTorr. A microwave of a frequency of 2.45 GHz was used, and a plasma was generated at a power of 1 kW. A high frequency electric field of a frequency of 400 kHz and a power of 600 W was applied to the sample holder 2a.

Figure 9:
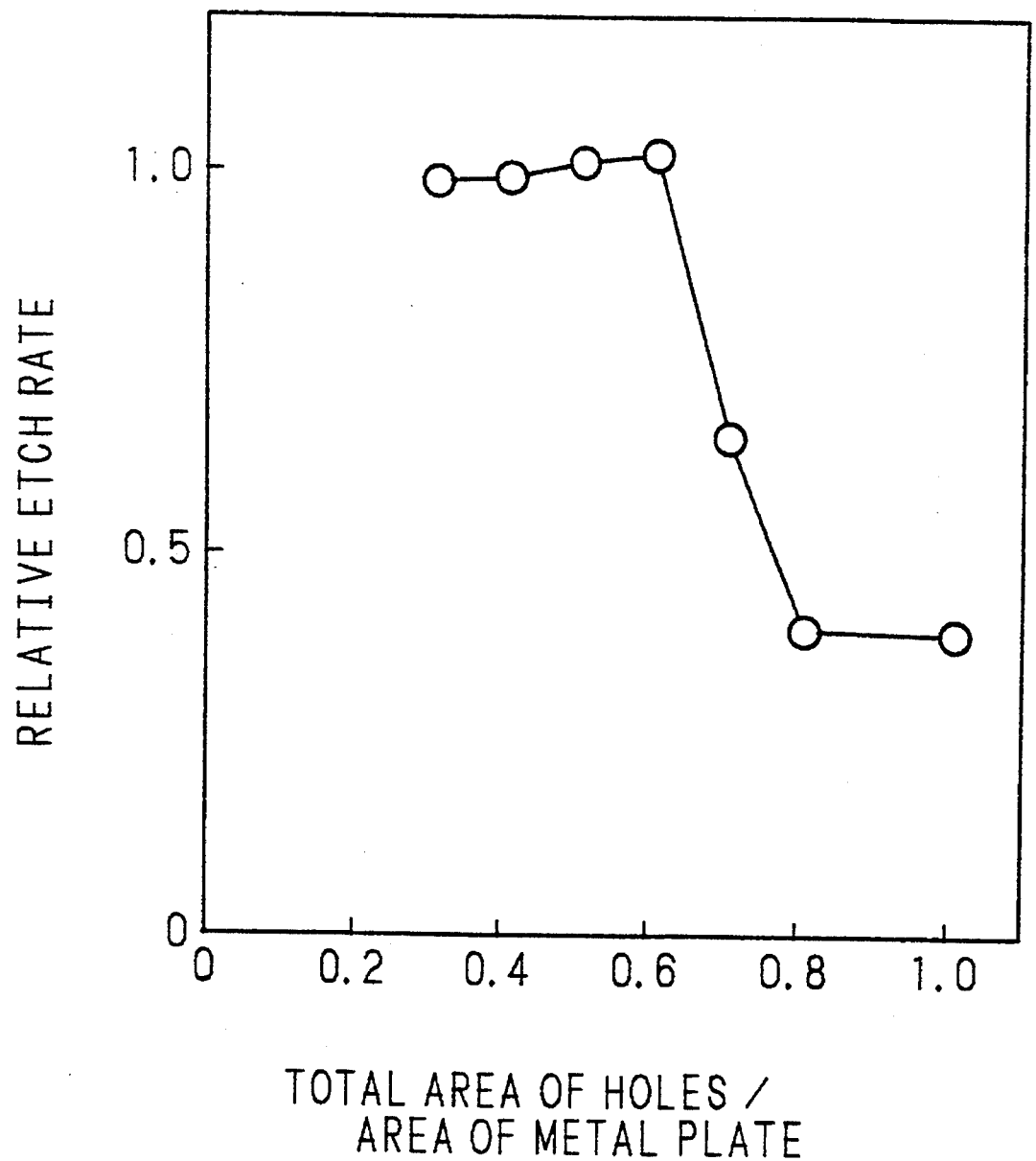
FIG. 9 is a graph showing a relationship between the ratio of the total area of the microwave transmission holes to the outer form area of the metal plate in Embodiment 2, and the relative etch rate.

FIG. 9 shows relationships between the ratio of the total area of the microwave transmission holes 15a to the outer form area of the grounded metal plate 15, and the relative etch rate of a silicon oxide film. The ratio of the total area of the microwave transmission holes 15a to the outer form area of the grounded metal plate 15 is given by "total area of microwave transmission holes (see FIG. 8A)"/ "outer form area of the metal plate (see FIG. 8B)", and the relative etch rate of a silicon oxide film is a relative value which is calculated in the assumption that the etch rate of a silicon oxide film is 1.0 when the ratio is 0.5. The results show that, when the ratio is greater than 0.65, the etch rate is lowered to a level which is not desirable in the view point of a practical use. It is considered that this phenomenon is caused by the following reason. When the ratio is greater than 0.65, the ground potential area is insufficient so that the ground potential with respect to the plasma becomes unstable, and therefore a stable bias voltage is not generated at the surface of the sample S. In contrast, when the ratio is smaller than 0.25, flickers of a plasma can be observed visually and it is difficult to maintain a stable plasma discharge state. It is considered that, when the ratio is smaller than 0.25, the transmittance of the microwaves into reaction chamber 21 is reduced and hence the plasma generation cannot be conducted stably.

As seen from the results, it is preferable to set the ratio of the total area of microwave transmission holes 15a to the outer form area of the grounded metal plate 15 to be in the range of 0.25 to 0.65.

In the above, the embodiment in which the microwave plasma processing system was used as an etching system has been described. The invention is not restricted to this. For example, the system of the invention can be used as a thin film forming apparatus.

As described above in detail, according to the embodiment, since the ratio of the total area of microwave transmission holes to the outer form area of the grounded conductor is set to be in the range of 0.25 to 0.65, a plasma can stably be generated and a stable bias voltage can be generated so that a stable plasma processing is performed.

Embodiment 3

Figure 10:
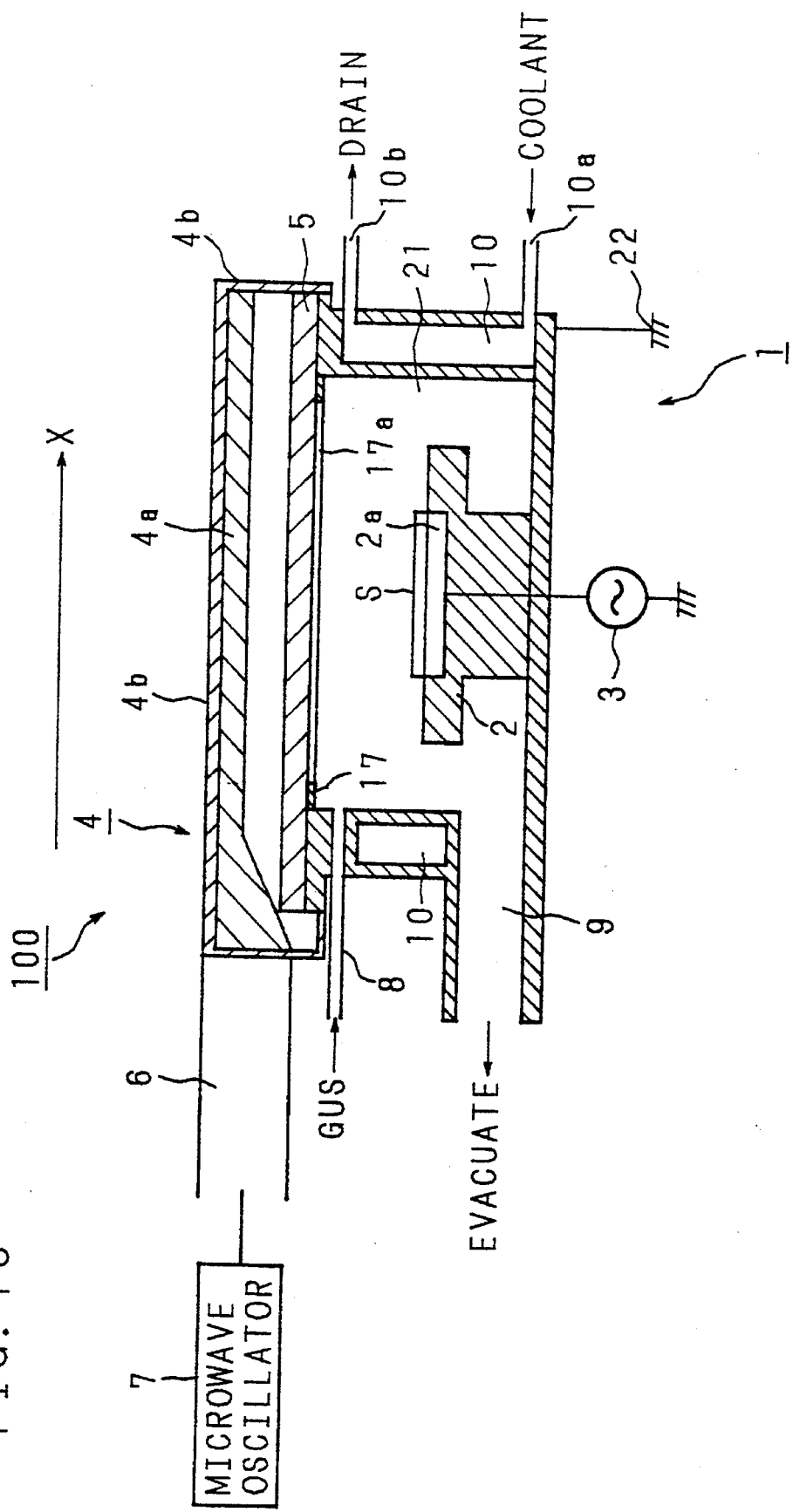
FIG. 10 is a schematic section view showing a microwave plasma processing system of Embodiment 3.
Figure 11:
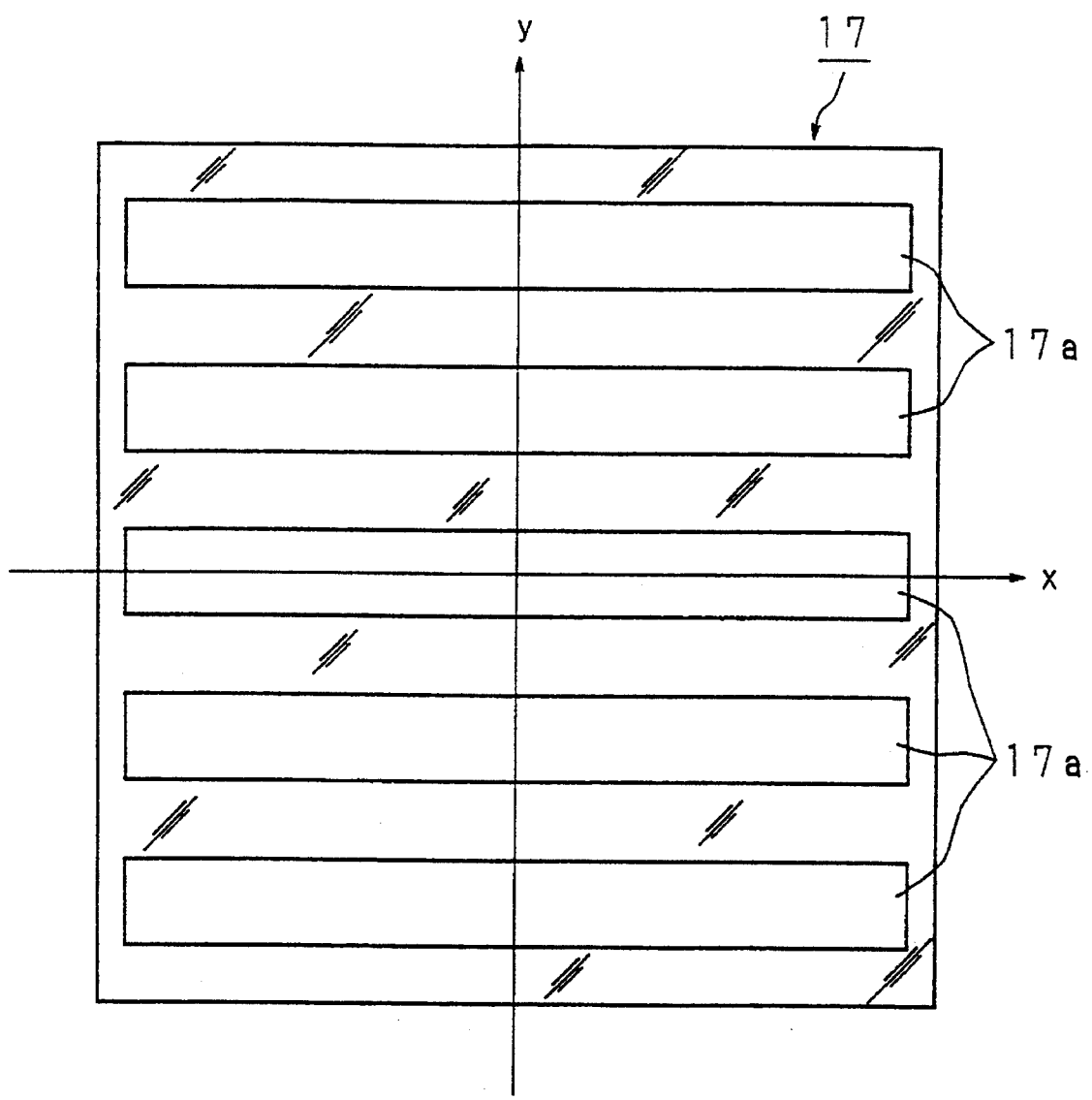
FIG. 11 is a plan view of a metal plate shown in FIG. 10.

FIG. 10 is a schematic section view showing a microwave plasma processing system of Embodiment 3. A metal plate 17 which serves as the conductor is disposed on the lower face of the microwave introduction window 5. A plurality of rectangular microwave transmission holes 17a which elongate in the direction parallel to the microwave traveling direction x as shown in FIG. 11 are formed in the metal plate 17 so that microwaves enter the reaction chamber 21. In the embodiment, the material of the metal plate 17 is aluminum (Al), and each of the microwave transmission holes 17a have a size of 30 mm ×300 mm. The metal plate 17 serves as a counter electrode with respect to the sample holder 2a, and has a function of generating a stable plasma voltage at the surface of the sample S. The other components are similar to those of Embodiment 1. These components are designated by the same reference numerals, and their description is omitted.

In the thus configured microwave plasma processing system, for example, a process of etching the surface of the sample S mounted on the sample holder 2a is performed in the following manner. First, evacuation is conducted through the gas discharge port 9, and reactant gasses are then supplied through the gas supply pipe 8 into the reaction chamber 21 so that the interior of the reaction chamber 21 is set to have a desired degree of vacuum. Cooling water is supplied from the cooling water inlet pipe 10a to be circulated in the passage 10, and then discharged into the cooling water outlet pipe 10b. Then the microwave oscillator 7 oscillates microwaves and the generated microwaves are introduced into the dielectric passage 4 via the waveguide 6 so that an electric field is generated in the lower portion of the dielectric passage 4. The generated electric field is transmitted through the microwave introduction window 5 and passes through the microwave transmission holes 17a formed in the grounded metal plate 17, with the result that a plasma is generated in the reaction chamber 21. Then the high frequency power source 3 applies a high frequency electric field to the sample holder 2a so that a stable bias voltage is generated at the surface of the sample S by the action of the grounded metal plate 17. Then the etching process is performed while causing ions in the plasma to be perpendicularly incident upon the surface of the sample S by the stable bias voltage, and controlling the energy of the ions.

Figure 12:
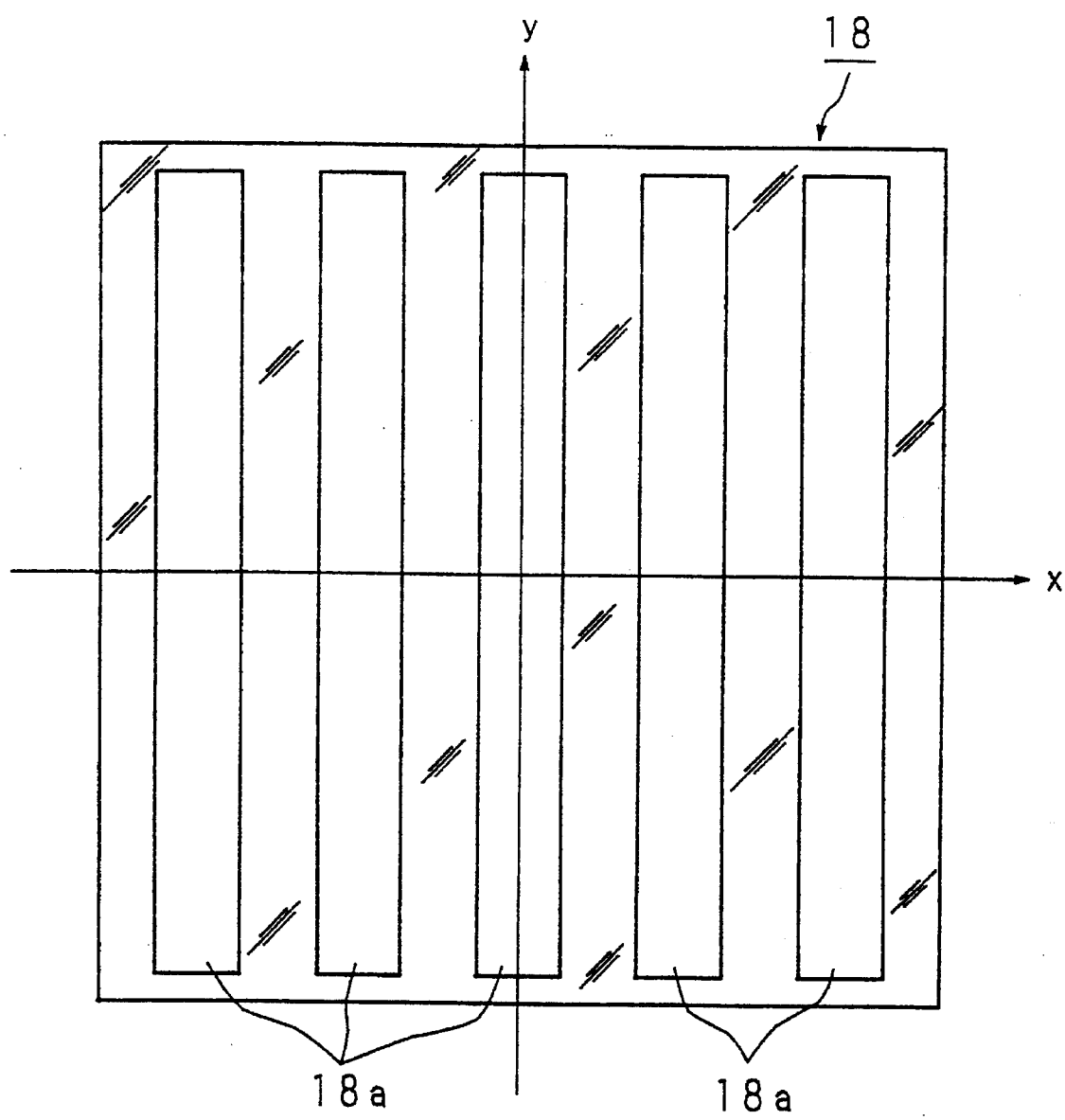
FIG. 12 is a plan view of a metal plate used in a microwave plasma processing system of a comparison example.
Figure 13:
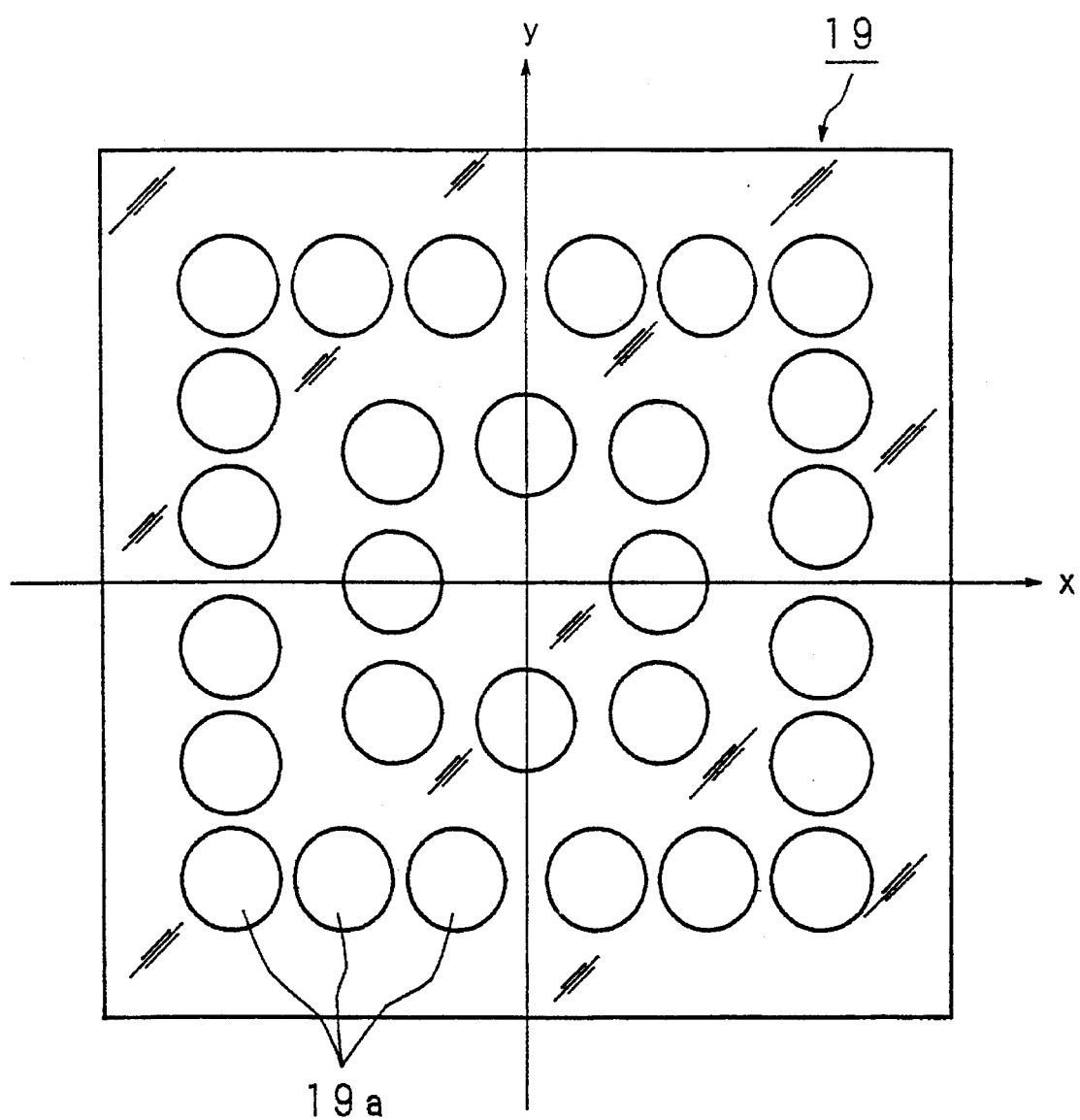
FIG. 13 is a plan view of a metal plate used in a microwave plasma processing system of another comparison example.
Figure 14:
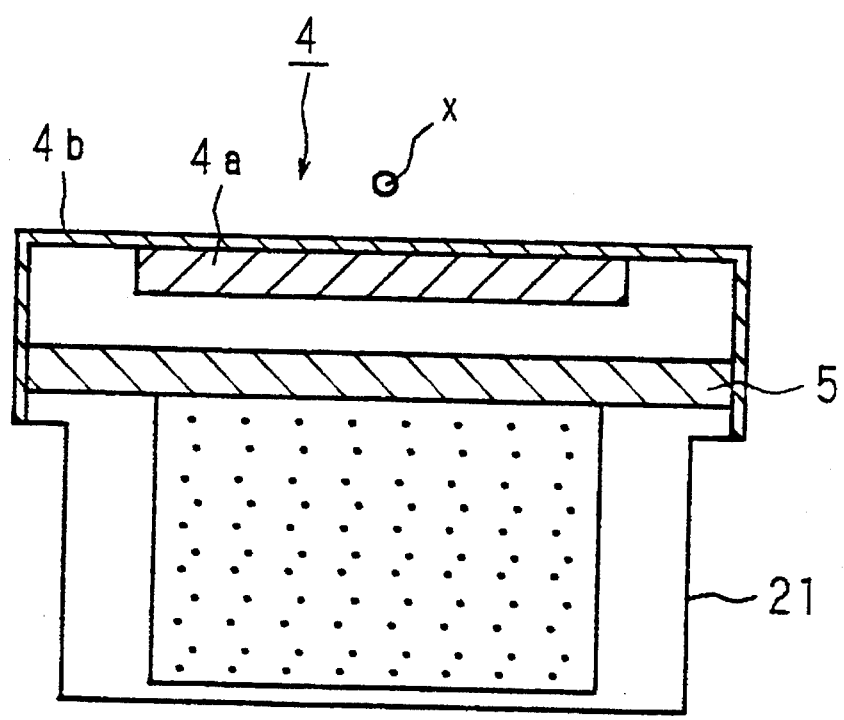
FIG. 14 is a section view showing a section of the microwave plasma processing system of Embodiment 3, taken in a direction perpendicular to the microwave traveling direction.

Hereinafter, results of processes of etching a silicon oxide film ($SiO_2$ film) which were performed conducted by using the system shown in FIG. 10 will be described. In the etching processes, 8-inch silicon wafers on which an $SiO_2$ film of 1 μm was formed were used as the sample S, and about 30 sccm of $CF_4$, about 30 sccm of $CHF_3$, and about 100 sccm of Ar were supplied as the reactant gasses. The gas pressure of the reaction chamber 21 was set to be about 30 mTorr. A microwave of a frequency of 2.45 GHz was used, and a plasma was generated at a power of 1.3 kW. A high frequency electric field of a frequency of 400 kHz and a power of 600 W was applied to the sample holder 2a. As comparison examples, experiments using grounded metal plates 18 and 19 in which microwave transmission holes 18a and 19a shown in FIGS. 12 and 13 are formed were conducted. FIG. 12 shows the metal plate 18 which is obtained by rotating the metal plate 17 shown in FIG. 11 by 90° so that the longitudinal direction of microwave transmission holes 18a is perpendicular to the microwave traveling direction x. FIG. 13 shows the metal plate 19 in which 28 microwave transmission holes 19a each having a diameter of 30 mm are formed symmetrically with respect to the center of the plate in such a manner that 20 holes (6 holes per edge) are arranged along the periphery of the plate and 8 holes (3 holes per edge) are formed in the center portion.

Results show that, in the system having the metal plate 17 shown in FIG. 11, the average etch rate of the $SiO_2$ film was 450 nm/min., and the uniformity of the etch rate in 8-inch silicon wafers was ±3%. By contrast, in the system having the metal plate 18 shown in FIG. 12, the average etch rate of the $SiO_2$ film was 400 nm/min., and the uniformity of the etch rate in 8-inch silicon wafers was ±15%, and, in the system having the metal plate 19 shown in FIG. 13, the average etch rate of the $SiO_2$ film was 360 nm/min., and the uniformity of the etch rate was ±5%.

When compared the results of the systems shown in FIGS. 11 and 12 with each other, the system having the metal plate 17 shown in FIG. 11 exhibits superior results in both the average etch rate and the uniformity of the etch rate. Particularly, there exists a large difference between the effects on the uniformity of the etch rate. When compared the results of the systems having the metal plates shown in FIGS. 11 and 13 with each other, the system having the metal plate 17 shown in FIG. 11 exhibits superior results in both the average etch rate and the uniformity of the etch rate. Particularly, there exists a large difference between the effects on the average etch rate.

As seen from the above-mentioned results, the system of the embodiment can etch a silicon wafer with a higher speed and in a more stable manner than the systems of the comparison examples. In this way, in the microwave plasma processing system of the embodiment, since the dimension of the microwave transmission holes 17a in the microwave traveling direction x in the dielectric passage 4 is greater than that in a direction perpendicular to the direction x, a plasma can be generated in a high density and uniform state and a plasma processing can be performed on the surface of the sample S at a high speed and uniformly.

Figure 15:
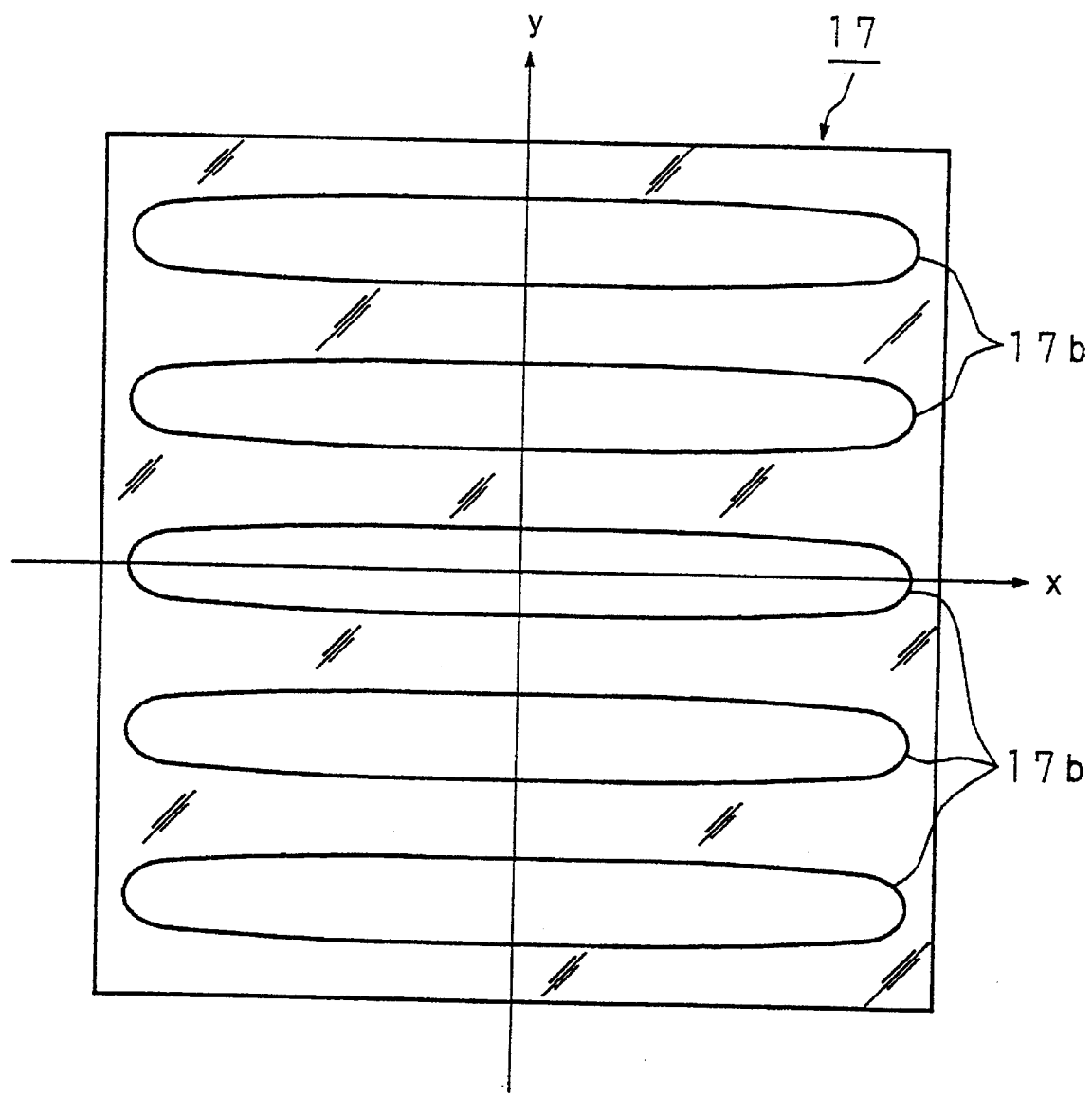
FIG. 15 is a plan view of another metal plate.

Even when a plurality of rectangular slits are formed as the microwave transmission holes in the direction x, the same effects can be expected as far as the conditions that the dimension of the microwave transmission holes 17a in the microwave traveling direction x in the dielectric passage 4 is greater than that in a direction y perpendicular to the traveling direction x are satisfied. In the view point of the uniformity of plasma generation, however, the number of the microwave transmission holes 17a in the microwave traveling direction x is preferably set to be a value as small as possible. Moreover, the conductor 17 may have microwave transmission holes 17b having elliptic shapes shown in FIG. 15. Further, it may be contemplated that the state same as the above in a pseudo meaning is obtained by forming a large number of small circular microwave transmission holes. As seen from the comparison example of FIG. 13, however, the electric field due to microwaves is largely attenuated when passing through the microwave transmission holes 19a, and hence the process efficiency is lowered.

In the above, the embodiment in which the microwave plasma processing system was used as an etching system has been described. The invention is not restricted to this. For example, the system of the invention can be applied also to other systems such as a thin film forming system and an ashing system.

As described above in detail, according to the embodiment, since the microwave transmission holes having a dimension in the microwave traveling direction which is greater than that in a direction perpendicular to the traveling direction are formed in the grounded conductor in the reactor, a plasma can be generated in a high density and uniform state and a plasma processing can be performed on the surface of a sample at a high speed and uniformly.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A microwave plasma processing system comprising:
   a microwave oscillator;
   a reactor to which a microwave oscillated by said microwave oscillator and a reactant gas are introduced;
   a waveguide for guiding the microwave to said reactor;
   a dielectric passage formed on one face of said reactor and connected to said waveguide;
   a microwave introduction window disposed in a manner that said reactor is partitioned into said dielectric passage and a reaction chamber;
   a sample holder disposed in said reaction chamber;
   means for applying an electric field to said sample holder;
   gas supplying means for supplying the reactant gas to said reaction chamber; and
   a conductor disposed between said microwave introduction window and said sample holder, the conductor having microwave transmission holes, a flow path communicated with said gas supplying means, and holes through which the reactant gas is to be blown toward a sample.

2. A microwave plasma processing system according to claim 1, wherein said conductor is disposed in contact with said microwave introduction window.

3. A microwave plasma processing system comprising:
   a microwave oscillator;
   a reactor to which a microwave oscillated by said microwave oscillator and a reactant gas are introduced;
   a waveguide for guiding the microwave said reactor;
   a dielectric passage formed on one face of said reactor and connected to said waveguide;
   a microwave introduction window which is disposed in a manner that said reactor is partitioned into said dielectric passage and a reaction chamber;
   a sample holder disposed in said reaction chamber;
   means for applying an electric field to said sample holder;
   means for supplying the reactant gas to said reaction chamber; and
   a conductor disposed between said microwave introduction window and said sample holder, the conductor having microwave transmission holes,
   wherein a ratio of a total area of said microwave transmission holes to an area of said conductor is in the range of 0.25 to 0.65.

4. A microwave plasma processing system according to claim 3, wherein said conductor is disposed in contact with said microwave introduction window.

5. A microwave plasma processing system comprising:
   a microwave oscillator;
   a reactor to which a microwave oscillated by said microwave oscillator and a reactant gas are introduced;
   a waveguide for guiding the microwave to said reactor;
   a dielectric passage formed on one face of said reactor, and connected to said waveguide;
   a microwave introduction window which partitions said reactor into said dielectric passage and a reaction chamber;
   a sample holder disposed in said reaction chamber;
   means for applying an electric field to said sample holder;
   means for supplying the reactant gas to said reaction chamber; and
   a conductor disposed between said microwave introduction window and said sample holder, the conductor having microwave transmission holes,
   wherein a dimension of each of said microwave transmission holes in a microwave traveling direction on said dielectric passage is greater than that in a direction perpendicular to said microwave traveling direction.

6. A microwave plasma processing system according to claim 5, wherein each of said microwave transmission holes has a rectangular shape.

7. A microwave plasma processing system according to claim 5, wherein each of said microwave transmission holes has an elliptic shape.

8. A microwave plasma processing system according to claim 5, wherein said conductor is disposed in contact with said microwave introduction window.

* * * * *